(12) United States Patent
Zank et al.

(10) Patent No.: US 6,922,059 B2
(45) Date of Patent: Jul. 26, 2005

(54) ELECTRIC FIELD SENSOR

(75) Inventors: Paul A. Zank, Brookline, NH (US);
Eldon M. Sutphin, Merrimack, NH (US); David W. Buchanan, Brookline, NH (US); Thomas G. Cehelnik, Cypress, TX (US)

(73) Assignee: BAE Systems Information and Electronic Systems Integration INC, Nashua, NH (US)

( * ) Notice: Subject to any disclaimer, the term of this patent is extended or adjusted under 35 U.S.C. 154(b) by 96 days.

(21) Appl. No.: 10/315,561

(22) Filed: Dec. 10, 2002

(65) Prior Publication Data
US 2005/0122118 A1 Jun. 9, 2005

Related U.S. Application Data

(63) Continuation-in-part of application No. 10/256,812, filed on Sep. 27, 2002.
(60) Provisional application No. 60/356,557, filed on Feb. 12, 2002, and provisional application No. 60/340,176, filed on Dec. 10, 2001.

(51) Int. Cl.[7] .................................................. G01R 5/28
(52) U.S. Cl. ...................... 324/457; 324/72; 340/854.8; 73/861.12
(58) Field of Search .......................... 324/457, 72, 347, 324/348; 73/861.12; 340/561, 564, 854.8; 250/334; 361/218

(56) References Cited

U.S. PATENT DOCUMENTS

| 3,260,893 A | | 7/1966 | De La Cierva et al. .... 361/218 |
| 3,641,427 A | * | 2/1972 | Pittman et al. ............. 324/365 |
| 3,790,884 A | | 2/1974 | Kohl ........................... 324/72 |
| 3,839,912 A | * | 10/1974 | Schmoock et al. ....... 73/861.12 |
| 3,857,066 A | | 12/1974 | Cline et al. ................. 361/218 |

(Continued)

OTHER PUBLICATIONS

Beaty, William J., Ridiculously Sensitive Charge Detector, 1987. http://www.amasci.com/emotor/chargdet.html pp. 1–6, no month available.

Hull, Richard, An Experimenters' Electrometer Sniffing out subtle electrostatic phenomena, http://www.amasci.com/electrom/sas51pl.html#electro, pp. 1–6, Dec. 1998.

AMPTEK, Electrostatic Analyzer Detector, Jul. 11, 2001, http://www.amptek.com/esa.html, pp. 1–2.

Beaty, William, Inexpensive FET Electrometer, 1994, http://www.amasci.com/electrom/e-field2.txt, pp. 1–3, no month available.

Primary Examiner—Vincent Q. Nguyen
(74) Attorney, Agent, or Firm—Maine & Asmus

(57) ABSTRACT

The invention is a detection system and in one embodiment uses inexpensive, miniaturized sensors for detecting electric field (E-field) disturbances. Such sensors are easily and covertly deployable and have low power consumption. The devices may incorporate visual or audio alerts and can include communications hardware for transmitting data for further processing of the electrostatic events.

20 Claims, 7 Drawing Sheets

U.S. PATENT DOCUMENTS

| | | | |
|---|---|---|---|
| 3,874,616 A | 4/1975 | Buser et al. | 244/17.11 |
| 4,005,357 A | 1/1977 | Parkinson | 324/457 |
| 4,101,825 A | 7/1978 | Truax | 324/458 |
| 4,529,940 A | 7/1985 | Blitshteyn | 324/458 |
| 4,703,179 A | 10/1987 | Motooka | 250/334 |
| 4,765,244 A | 8/1988 | Spector et al. | 102/213 |
| 4,812,713 A | 3/1989 | Blanchard | 315/370 |
| 4,812,822 A | 3/1989 | Feltz et al. | 340/572.2 |
| 4,818,855 A * | 4/1989 | Mongeon et al. | 235/440 |
| 4,825,149 A | 4/1989 | Voss et al. | 324/72 |
| 4,839,581 A | 6/1989 | Peterson, Jr. | 324/72 |
| 4,931,740 A | 6/1990 | Hassanzadeh et al. | 324/457 |
| 4,975,686 A | 12/1990 | Delcourt | 340/659 |
| 4,996,473 A | 2/1991 | Markson et al. | 324/72 |
| 5,164,673 A | 11/1992 | Rosener | 324/457 |
| 5,241,518 A | 8/1993 | McNelis et al. | 367/127 |
| 5,321,615 A | 6/1994 | Frisbie et al. | 701/24 |
| 5,430,448 A | 7/1995 | Bushman | 342/52 |
| 5,485,092 A | 1/1996 | Fortin | 324/457 |
| 5,544,129 A | 8/1996 | McNelis | 367/127 |
| 5,771,020 A | 6/1998 | Markson et al. | 342/460 |
| 5,828,334 A | 10/1998 | Deegan | 342/90 |
| 5,903,225 A | 5/1999 | Schmitt et al. | 340/525 |
| 5,959,548 A | 9/1999 | Smith | 340/854.8 |
| 5,963,146 A | 10/1999 | Johnson et al. | 340/870.01 |
| 5,977,762 A | 11/1999 | Murtha, Jr. et al. | 324/72 |
| 6,014,447 A | 1/2000 | Kohnen et al. | 381/86 |
| 6,084,551 A | 7/2000 | Aslan | 343/725 |
| 6,088,585 A | 7/2000 | Schmitt et al. | 455/411 |
| 6,178,141 B1 | 1/2001 | Duckworth et al. | 367/127 |
| 6,196,130 B1 | 3/2001 | Crist et al. | 102/221 |
| 6,260,797 B1 | 7/2001 | Palmer | 244/49 |
| 6,445,294 B1 * | 9/2002 | McDonnell et al. | 340/562 |
| 6,456,198 B1 | 9/2002 | Kato et al. | 340/564 |
| 6,552,521 B1 * | 4/2003 | Medelius et al. | 324/72 |
| 2002/0082769 A1 | 6/2002 | Church et al. | 701/120 |

* cited by examiner

ELECTRIC FIELD SENSOR

RELATED APPLICATIONS

This application claims the benefit of U.S. Provisional Applications No. 60/340,176, filed Dec. 10, 2001, and No. 60/356,557, filed Feb. 12, 2002. In addition, this application is a continuation-in-part of U.S. application Ser. No. 10/256,812, filed Sep. 27, 2002. Each of these applications is herein incorporated in its entirety by reference.

FIELD OF THE INVENTION

This invention relates to electrostatic sensors and to detecting, discriminating, and identifying electrostatic signatures caused by unintentionally created and naturally occurring electrostatic fields.

BACKGROUND OF THE INVENTION

Changes in the Electric-field (E-Field) are often unintended and unavoidable electrostatic emissions in the spectrum from sub 1 Hz to greater than 1 MHz. E-field distortions are caused by the spatial imbalance of electric charges. The electric field distortions in one instance are the result of a charge imbalance while others result from the distortion of the natural atmospheric potential gradient. Examples of E-field distortions include high voltage power lines, plasma from muzzle blasts, bullets in flight, rocket exhausts, jet afterburners. Further examples of E-field distortions include the surface friction on some materials such as plastics, helicopter rotors, and certain aerosols. Even animals and objects that are moving cause detectable distortions. For example, humans afford sufficient conductivity to measurably distort the isopotential lines of the proximate E-field as they move.

Unlike visual, infra-red, audio, and other spectra detected using prior art sensors, there has been far less research in the measurement and use of E-fields. There are also no known or readily apparent masking or countermeasure techniques or devices available for masking or concealing E-field distortions or for frustrating sensor detection of E-field distortions. As a result, the E-field sensing and processing makes practical use of spectrum that is virtually unexploited by the prior art.

dictates the sensor or sensor combination that accomplishes the objectives. The range may depend upon such factors as smoke, haze and noise interference, which could be appreciable in battle field conditions. The bandwidth refers to the volume of data required to relay an intelligence signal for processing. The countermeasures indication refers to present conditions, and the countermeasures typically follow advanced sensor capabilities.

There are many existing security and defense systems used for detection and identification of persons and objects, whether on the ground, underground or air-borne. Such systems are utilized whether for military applications or simple home security. The cost, complexity and installation difficulties of state of the art detection schemes make commercial implementation expensive and difficult.

Operational flexibility of sensor deployment is also somewhat limited by sensor size and power requirements. In contrast to miniaturized sensors, large sensors tend to consume more power and are particularly disadvantageous when sensor concealment is desired. Further, active-emitter sensing devices invite counter-detection and generally consume more power than emit-on-demand and totally passive sensors.

In addition, multi-sensor systems are preferred in order to provide broader detection, provided that the sensors are small and consume little power they can cooperate with other sensors to enhance overall performance. Prior art detection schemes have incorporated varied sensors but E-field sensing has generally been ignored. And, as noted herein, many of the existing sensor types are subject to schemes to defeat the sensors.

In the home and business security area, there is considerable money spent on security systems. The sophistication and cost varies, but there is a huge volume market that is continuously seeking improvements that improve performance and lower costs. There are simple contact sensors on doors and windows that are triggered when opened. Microwave and active emission sensors continuously emit a signal and look for disturbances in the received signals. Laser and other optic systems form optical paths between sensors and are triggered when the path is blocked. While some of these sensors require fixed wire connections for power and communication, the prior art does discuss wireless embodi-

TABLE A

Sensor type comparison

| Sensor type | Range | Active/Passive | Bandwidth | Power | Size | Weight | Counter measure |
|---|---|---|---|---|---|---|---|
| Electro-Optical (EO) | Short | Passive | Medium–large | Low | Small | Light | yes |
| Infra-Red (IR) | Short | Passive | Medium–large | Medium | Medium | Medium | yes |
| Ultra-violet (UV) | Short–medium | Passive | Medium–large | Low | Small | Light | yes |
| RF | Medium–long | Passive | Small–large | Very low | Small | Light | yes |
| E Field | Short | Passive | Small | Very low | Extremely small | Extremely light | no |
| Radar | Short–long | Active | Low–large | Medium–high | Medium–large | Medium–heavy | yes |
| Acoustical | Short | Passive | Low | Very low | Very small | Light | yes |
| Seismic | Short–medium | Passive | Low | Low | Small to large | Medium to heavy | no |
| Magnetic | Short | Passive | Low | Very low | Small | Light | yes |

As noted in Table A, several sensor types are compared according to different criteria. As shown, the sensors each have distinguishing attributes and the specific application ments. While the wired versions are more difficult to install, they provide unlimited power, even though they may be made inoperable when the connections are disconnected.

The prior art systems can employ batteries, but these active systems tend to consume substantial power.

With respect to military applications, the success of existing indication and warning (I&W) sensors and related intelligence detection and collection systems are being met with increasingly sophisticated countermeasures and conscientious efforts by opposing forces on concealment and location of sensitive facilities in highly cluttered areas. Further, many critical applications in which existing multi-spectral sensors are used are also susceptible to harmful interference, jamming, and other countermeasures. For example, photographic sensors can be frustrated by deliberate concealment and weather; electromagnetic sensors by masking, jamming, and clutter; and infrared sensors by shielding and decoys.

The improvements in satellite technology providing precision visual sensing for intelligence gathering. However, many operations have placed sensitive facilities and operations out of sight and in highly cluttered areas to avoid detection. Concealment attempts require continued efforts to gather intelligence using new techniques and systems that sense unavoidable detection.

For example, typical military sensor systems use active elements such as radar to detect threats. However, active transmissions are readily detected and compromise the sensing unit by emitting detectable signals. Radar and communications signal detection devices rely on the radiation emitted intentionally by the threat source. To avoid detection, the threat platform can vary or scramble the emitted signals to avoid or confuse the detection systems. Visible and infrared emissions generated by engine exhausts and skin-friction heat are much more difficult to control than radar emissions. Although infrared does not propagate beyond the visual horizon, threat detection is adversely affected by rain, fog, clouds, and hills. Acoustic energy from engines propagates in the air, however the atmosphere substantially attenuates the acoustic signal, and thermal gradients in the air causes refraction of sound and wind cause unpredictable distortion and shadow zones.

Thus, passive detection means are preferred, as there are no emissions. As noted in the prior art, passive sensors are used to sense acoustic energy, radar frequencies, communications signals and infrared. However, each of these detection systems suffers from deficiencies.

There are numerous papers and articles that discuss some electric field sensing devices. The prior art describes simple circuits with wire antennas and a field effect transistor (FET) that perform hobbyist experiments such as detecting static electricity from combing hair and static charge created by walking across a carpet. These devices are noted as being extremely sensitive and detect all types of charges. However, the prior art is devoid of information as to refinements of detection and post measurement processing.

There have been general attempts in the prior art for sensing electric charges. One approach to passive detection is to analyze electromagnetic radiation, as described in U.S. Pat. No. 5,828,334. This invention recognizes that there is an observable phenomenon caused by the molecular kinetics in gas turbines, rocket engines and other combustion/explosive processes, where some of the gases are ionized. Any acceleration of a charge causes the electrostatic field to be distorted and electromagnetic radiation to be generated. The strength of the radiation generated by a partially ionized gas is directly proportional to the number of ions present, and correlates to the temperature, fuel rate, and the type of fuel used. The proportion of fuel molecules ionized in a simple hydrocarbon flame is exceptionally large, and the acceleration of ions causes an electromagnetic radiation with a strength that can be computed using the well-known Larmor's formula.

Ions are accelerated by several mechanisms in the engine and radiate electromagnetic waves at frequencies that are a function of the source of the acceleration. The frequencies and disturbances created by the combustion/explosion are related to mechanical characteristics. Detectable radiation from ions is derived from four causes. The first is cyclotron radiation caused by the earth's magnetic field, and the field imposes a force on the ion that accelerates it. The second source of ion acceleration and radiation is acoustic or hydrodynamic acceleration of ions that produces electromagnetic radiation, wherein this form of radiation tends to emulate the spectrum of the sounds made by the engine. The third source of acceleration of the ions is from the turbulence of the stream of gas after exiting from the engine's nozzle. As the stream from the nozzle interacts with the static gas of the atmosphere, it forms a characteristic fluid velocity field called a jet, which is a distribution of gas motion that gradually distributes the energy of the exhaust flow into the atmosphere. The fourth source of ion frequencies is mechanical acceleration of ions due to throttling in nozzles and flow alteration by turbines.

There are prior art patents for detecting missiles and aircraft, such as U.S. Pat. No. 4,703,179, which is a sensor to measure infrared or electro-optical radiation. In U.S. Pat. No. 4,765,244, there is device that measures near-infrared, far-infrared, and ultraviolet light emissions from missiles in conjunction with radar proximity information to detect and locate a missile. U.S. Pat. No. 5,430,448 senses the flicker of ultraviolet radiation in an exhaust plume and radio frequencies from nose shocks and blade-tips to detect and classify aircraft. U.S. Pat. No. 6,014,447 describes a passive vehicle identification system by analyzing the low frequency electromagnetic emanations of a vehicle engine. Another related application of sensor devices is to detect bullets and muzzle blasts. Various sensor devices such as acoustics are well known, with applicable limitations. An acoustic counter-sniper system is described in U.S. Pat. No. 6,178,141, which describes a sniper detection and localization system that uses observations of the shock wave from supersonic bullets to estimate the bullet trajectory, Mach number, and caliber. Muzzle blast observations can be used to roughly estimate a sniper location along the trajectory. The system utilizes a distributed array of acoustic sensors to detect the projectile's shock wave and the muzzle blast from a firearm. There are prior art patents that are used for determining the general direction and trajectory of projectiles. For example, U.S. Pat. No. 5,241,518 uses three spaced-apart sensors that are positioned to encounter the shock wave generated by a supersonic projectile. The sensors generate signals in response to the shock wave of the projectile that is related to the azimuth and elevation angle of a unit sighting vector from each sensor to the origin of the shock wave. A unit vector, while having direction, has no magnitude (representative of distance in this case). Another prior art system utilizes a blast wave from a fired projectile to determine the origin of the projectile, as described in U.S. Pat. No. 5,544,129, and depends on the signals generated by the transducers forming time relationships between the transducers when the blast wave serially encounters each of three required transducers. From these time relationships, at least one unit sighting vector is determined from at least one sensor to the origin of the blast wave and that unit sighting vector is considered to point in the general direction of the origin of the projectile.

However, as previously noted, the acoustic signal representative of muzzle blast can easily be corrupted after it is generated, such as by attenuation or distortion introduced by structures, e.g. buildings, topology etc, in the path of the blast as it travels toward the sensors. Similarly, in a reverberant environment, multipath arrivals of the shock wave can obscure the blast wave, which always arrives later than the shock wave. A muzzle blast waveform tends to have a lower signal to noise ratio making it difficult to precisely measure its time of arrival. Moreover, silenced weapons fire will go undetected by an acoustic system.

The Army Research Labs (ARL) have also made attempts in measuring electrostatic fields for detection purposes. The ARL discloses one detection system, wherein the ARL system is an E-field sensor system that can be incorporated into arrays with some source/signature correlation and approximating locations of the target source.

Accordingly, a need exists for I&W sensors and related systems against which existing tactics and countermeasures are less effective, and which can be operationalized and deployed at modest cost. Use of advanced low-cost, low power, low noise, high impedance amplifiers in combination with advanced digital signal processing enables reception and analysis of unintentionally created E Fields and E-field distortions. The prior art has not exploited the E-field spectrum, and tactical and technological defenses are not available to frustrate E-field sensors. The present invention extends the detection spectrum into the E-field spectrum from sub 1 Hz to greater than 1 MHz. The passive E-field sensors of the present invention can be embodied in extremely small and inexpensive devices requiring very little power, such that practical E-field sensors and E-field detection systems can be implemented.

In addition, the present system describes the system for pedestrian detection using the DC component for the walking signature and the AC component to track individual footsteps. In addition, the present system also addresses detecting certain weapon effects, small and large caliber muzzle blasts, rocket exhausts, jet afterburners, power/tension lines and motor loads. The unique measuring and processing of the present invention enable such measurements as described herein.

BRIEF SUMMARY OF THE INVENTION

Embodiments of the present invention are included herein, wherein the present invention is designed in contemplation of the deficiencies of the prior art. The present invention is an E-field detector system including at least one E-field distortion sensor that can detect distortion of the E-field by a person, vehicle, weapon, or electric power source. The present invention compensates for background noise in the E-field by using coherent signal processing to isolate the detected source from the background noise and thus enable correlation of the distortion source with its electrostatic signature. It is low cost, passive, low power, long life, and extremely small. The detection spectrum includes the E field from sub 1 Hz to greater than 1 MHz.

As the E field travels at the speed of light, the measurements can alert to various dangerous conditions. There is little if any attenuation because of dust or smoke, which can affect other sensor types. And, while the deficiencies in audio and visual sensors are well Known, the present invention provides a completely different set of data. In addition, combining the E field sensors with other sensor type results in a superior detection capability that can function in almost any environment.

E-field sensors and systems according to the present invention exploit unintended and unavoidable electrostatic emissions in the spectrum from sub 1 Hz to greater than 1 MHz. For example, humans afford sufficient conductivity to measurably distort the isopotential lines of the proximate E-field. Thus, a person walking in the vicinity of an E-field sensor can be detected by the E-field distortion created. However, unlike visual, infra-red, audio, and other spectra detected using prior art sensors, there are no presently known or readily apparent masking or countermeasure techniques or devices available for masking or concealing E-field distortions or for frustrating sensor detection of E-field distortions.

In a motion sensor embodiment, the devices can incorporate audio and/or visual indicators that are activated once a threshold E-field distortion is detected. There are numerous audible alerts commonly available to generate various high volume outputs. Visual indicators such as light emitting diodes (LED's) are commonplace and can be used alone or in combination with other indicators. Passive alerts have also been contemplated whereby inaudible signals are generated. The sensors may also communicate to a central host either by wired connection or wireless connectivity. A data link from among a set of sensors to a central processor is one preferred embodiment. Other applications for motion sensing are intended as simple counting units, such as persons, animals or vehicles that pass about a certain location, whereby a microcontroller stores such information for retrieval or periodic transmission.

As a home security device, the E-field sensor can replace or augment existing sensing units. As a passive and compact unit it can be incorporated into small spaces and have independent alert indicators or be coupled to a central unit by wire or wireless communications links. Due to its small size and low power consumption, the sensor can easily be placed within nightlights, smoke detectors and similar units to be inconspicuous.

One embodiment of the present invention detects E-field distortions caused by the spatial imbalance of ions, the presence of static generators, objects in contact with the ground that distort the existing E-field, and high voltage sources. The invention therefore has corresponding utility for applications involving detecting persons and conveyances in motion. The devices are small and inexpensive to be expendable in military applications and establish a perimeter defense or a field that detects any movement above a certain threshold level. The devices can be scattered about a location to provide comprehensive coverage.

Not only do the devices detect motion of persons or objects, but they also provide detection of plasma from muzzle blasts, rocket exhausts, jet afterburners, helicopter rotors, and power generation/distribution systems. Thus the E-field sensors can detect and alert personnel to various threats.

In addition, the use of at least two (2) E-field sensors in conjunction coherent signal processing enables substantial reduction of background noise. This permits detection of E-field distortion at greater ranges and sensitivity and facilitates signature correlation of the detected object with characteristic E-field distortions of like and similar sources.

Comparing three sensor types with respect to tracking bullets and projectiles, namely E field, Infrared, and acoustic, each has certain advantages and deficiencies. For example, IR sees all events from a very wide filed of view and tries to classify everything in the time domain. But, these sensors are easily tricked by countermeasures, blinded by interstitial clouds, and not capable of viewing the subsonic portion of a bullet trajectory. Acoustic sensors are not affected by interstitial clouds, although the atmospheric conditions can cause distortion and multipathing of the muzzle sound. In addition, these sensors are affected by differing wind noises making it difficult to lower the noise floor and there is minimal measurement capability in the subsonic part of the bullet trajectory. The E field is subject to certain atmospheric conditions that create a highly ionized state, however, they are not effected by interstitial clouds and other atmospheric conditions.

A combination of two (2) or more of the present invention's E-field sensors, or the combination of at least one (1) E-field sensor in conjunction with at least one (1) other sensor can be used in determining the range and approximate location of the source of the E-field distortion. For example, a single proximate E-field sensor operating in concert with at least one audio sensor at the time of a muzzle blast or rocket ignition can provide range information to the source through processes presently known. Similarly, additional E-field and prior-art sensors can be used according to processes presently known to reduce ambiguity of the distortion source's geographic location.

One object of the invention is related to the detection of electric power lines. Every year airborne objects become entangled in electric power lines causing damage to human life and property. Aircraft such as personal planes, crop dusters, helicopters, aerial advertising aircraft, as well as other airborne vessels such as unmanned aerial vehicles, balloons, gliders, parachuters and hangliders are at risk of striking the power lines which are difficult to discern even when marked. The sensor device of the present invention detects the electric field disturbance caused by the flow of electricity through the lines. The sensors detect the disturbance and can generate an alert of the hazard.

As known in the art, unmanned aerial vehicles (UAV's) are expendable units that can be used as the eyes and ears of military actions. The UAV's help protect ships, planes, bases, manned fortifications, and ground forces, and although expendable, they are very expensive. They are used to detect unfriendly airplanes and missiles and for precision targeting of enemy installations. Unfortunately, UAV's are very susceptible to air and ground launched missiles as they are slow moving and not highly maneuverable. Units like the Predator arc typically unaware of danger until it is too late and ground crews are launching strikes. The use of the passive, inexpensive, and small electrostatic sensors extend the capabilities of the UAV's to detect potential danger and take appropriate actions through navigation or countermeasures. Such actions may only be to plan for destruction and synchronize hand-off to another UAV, but such continuity is important for strategic planning. In addition, the device can be set to self-destruct to ensure proper destruction of proprietary technology. The ability to detect and determine projectile trajectory, high explosive detonations (flack), helicopters and other aircraft, lightning, and other E field disturbances from missiles provides a military advantage.

Certain deployable sensor units are used in battlefield conditions and are deployed as a self-healing network. These low power, rugged, miniature, networked/autonomous units are hand emplaced or delivered by projectiles, mortars or missiles. In combination with the E field sensor of the present invention, which occupies little space and consumes little power, the detection capabilities are greatly enhanced. There are other forms of delivery for sensing units including mini and micro air vehicles which are small units somewhat akin to the radio controlled planes in the public marketplace. However the military versions include sensitive electronic sensing components such as the electrostatic sensor described herein, and provide a data feed to a command center. These 'eyes and ears' for battle deployment can monitor enemy movements and provide threat alerts as well as be used for targeting purposes.

One object is an electric field sensor for detecting electrostatic field disturbances, comprising a sensing element for detecting electric field signals, a guard area proximate the sensing element and a differential amplifier stage with bootstrapping coupled to the sensing element. There is a filter stage connecting to the output side of the amplifier stage and an analog to digital converter coupled to the filter stage for converting the electric field signals to digital data. Finally, there is a microcontroller coupled to the analog to digital converter for processing the digital data.

Other objects of the invention include the electric field sensor further comprising a transceiver coupled to the microcontroller, a partial Faraday shield covering a portion of said sensing element, a means for setting a threshold level, a visual and/or audio indication. There can be a a second amplifier stage between said filter stage and said analog to digital converter. Furthermore, the filter stage can be a notch filter, a bandpass filter, a highpass filter or a lowpass filter.

An object of the invention is an electric field sensor for detecting electrostatic field disturbances, comprising a first sensing element for detecting electric field signals, a first preamplifier coupled to the sensing element, wherein the first preamplifier is coupled to a first bootstrapping circuit.

There is a second sensing element for detecting electric field signals with a second preamplifier coupled to the second sensing element, wherein the second preamplifier is coupled to a second bootstrapping circuit. A differential amplifier coupled to the first preamplifier and the second preamplifier and there is a filter stage connecting to the differential amplifier. An analog to digital converter is coupled to the filter stage for converting the electric field signals to digital data. Finally, there is a microprocessor coupled to the analog to digital converter for processing the digital data.

Another object of this invention includes the electric field sensor, further comprising a gain stage coupled between the filter stage and the analog to digital converter.

A motion sensing device, comprising a power source, at least one sensing element for detecting electric field disturbances of moving objects, a differential amplifier with a bootstrap configuration coupled to the sensing element and a filter section connecting to the differential amplifier. An analog to digital converter is coupled to the filter section for converting the electric field signals to digital data. And, a microcontroller is coupled to the analog to digital converter for processing the digital data Yet a further object is the motion sensing device, further comprising a guard proximate said sensing element, a global positioning system., four sensing elements placed apart and orthogonally oriented, and even wherein the moving objects are selected from the group comprising humans, animals, vehicles, and cargo. There can even be a data link from said device to a host system.

Still other objects and advantages of the present invention will become readily apparent to those skilled in this art from the detailed description, wherein we have shown and described only a preferred embodiment of the invention, simply by way of illustration of the best mode contemplated by us on carrying out our invention. As will be realized, the invention is capable of other and different embodiments, and its several details are capable of modifications in various obvious respects, all without departing from the invention The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

BRIEF DESCRIPTION OF THE DRAWINGS

The invention will be better understood upon reading the following Detailed Description in conjunction with the drawings in which.

DETAILED DESCRIPTION OF THE INVENTION

To those skilled in the art, the invention admits of many variations. The following is a description of a preferred embodiment, offered as illustrative of the invention but not restrictive of the scope of the invention. Electro static event (ESE) sensors and systems according to the present invention exploit unintended and unavoidable electrostatic emissions in the spectrum from sub 1 Hz to greater than 1 MHz. The sensors are passive, low cost, small, low power and examine unintended or unavoidable emissions.

Figure 1:
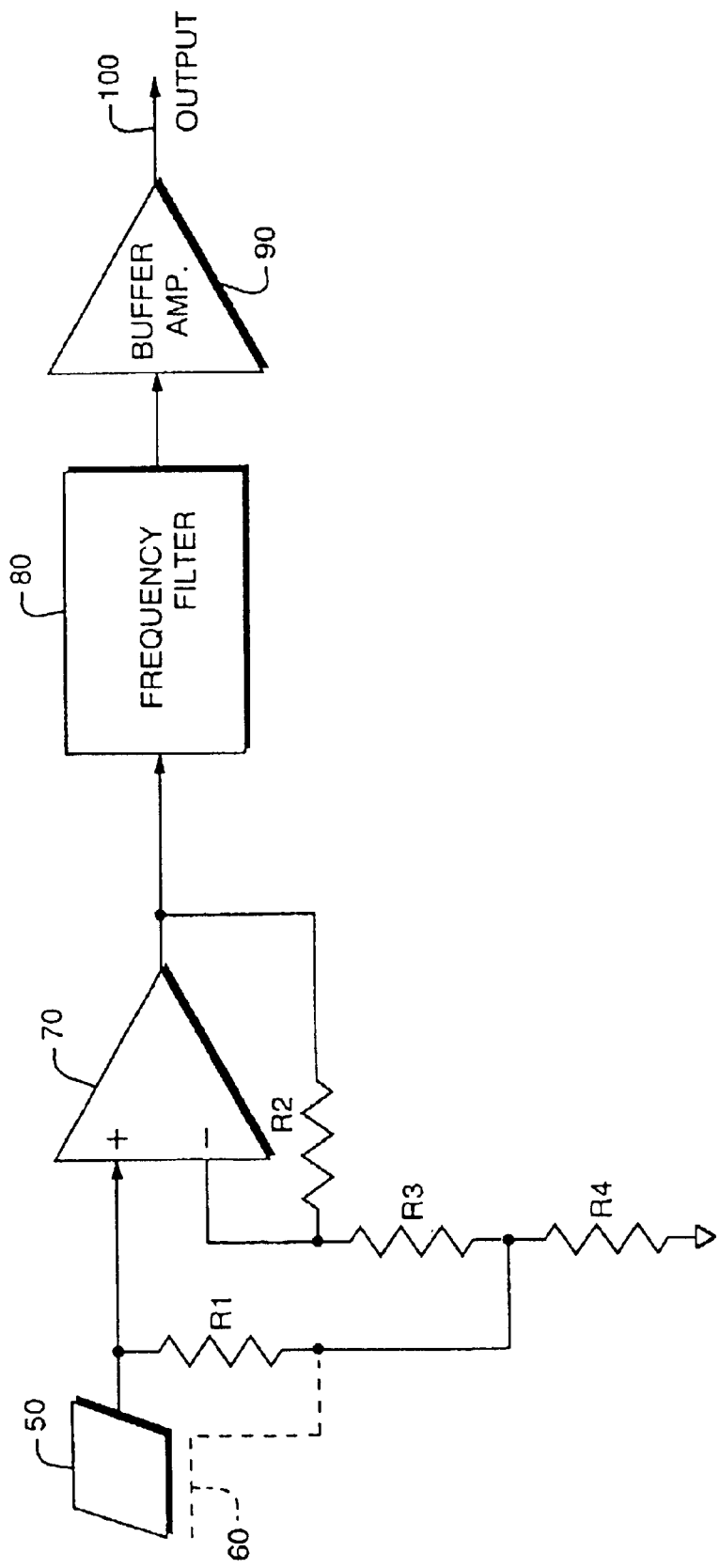
FIG. 1 is a basic block diagram representation of the present invention showing the sensing area, guard, high impedance amplifier with bootstrapping, filter and buffer amplifier.

FIG. 1 is a block diagram representing a simple embodiment of the present invention sensor for detecting E-field distortions illustrating the circuit arrangement as well as the interconnection of the inputs and outputs. The sensing area 50 or "antenna" is generally a small receptive element, and in a preferred embodiment the sensing area 50 is a printed wiring board (PWB) etch or pad although it could also be an external sphere or other receptive unit.

The sensor area 50 in FIG. 1 can essentially be regarded as one side of a capacitor with the other side being the charged source or even the earth's field being the source. The larger the area the greater the sensitivity, however interference and extraneous signals become problematic if the reception is too high. In one embodiment the pad is approximately 1/30 inch and picks up signals as low as 200 millivolts. Experimentation of other sensing areas from about 1/10 of a square inch to several inches has resulted in different data measurements and the size of the antenna depends upon the application and environmental conditions.

There is a guard area 60 proximate the sensing element which functions to reduce the 'capacitance'. In one embodiment where the circuit is laid out on a printed circuit board, the guard area is a wiring board etch on the opposite side of printed circuit board opposing the sensing area 50. The guard 60 primarily eliminates the capacitance of the shield, such as coax cable, thereby greatly increasing the antenna 50 impedance. The sensing area 50 does not need to be a large area sensing element, as experimentation revealed that large sensing elements picked up too many extraneous signals to be useful. In one embodiment the sensing element 50 is designed for maximum input impedance with a partial Faraday shield (not shield) covering a portion of the sensing area 50 to reduce the gain.

Thus, the size of the sensor area 50 is one method to adjust system gain, while another adjustment mechanism is the shielding. Subsequent signal processing and filtering is used to reject unwanted signals, for example, narrow pulses or relatively high frequency signals such as those caused by lightening, arc welders, and RF sources are rejected. It should be noted that a typical signal response in the range of 0.1–5 kHz does not have any DC bias.

The differential amplifier 70 is used with bootstrapping to establish high impedance and provide amplification. The gain of the differential amplifier 70 is determined by the resistors R2, R3, and R4 and as is well known in the art, that the gain is equal to (R2+R3+R4)/(R3+R4). The resistors R3 and R4 determine the percentage of input signal that is coupled to one side of R1 and the guard 60. For example, R3=1 k and R4=9 k, the voltage at the junction of R3 and R4 is 90% of the voltage at the sensing area 50. In effect, R1 appears ten times larger, and the capacitance of the sensing area 50 to be ten times lower.

Expressed differently, if the voltage at the junction were 99.9% of that present at the sensing area 50, the R3 would appear 1000 times larger and the capacitance of the sensing area 50 would appear to be 1000 times smaller. Thus the ratio of R3 to R4 determines the input resistance to the amplifier 70. It is preferred to make the input impedance very high without having amplifier 70 saturate due to its input bias currents. Typical feedback ratios are from 90% to 99% while the value of R1 might be 10 Mohms, giving an effective input resistance of 100 to 1000 Mohms or more.

In a preferred embodiment, the differential amplifier 70 is a field-effect operational amplifier U1 (op amp TLC2272) with bootstrapping to provide high impedance for the sensing element 50. In this circuit, the sensing element 50 is a small metallic piece that is part of the printed wiring board, such as an etch on the board. The sensing element signal is amplified and converted to a low source impedance. R1 is 10 Mohm, R2 is 6.04 Kohm, R3 is 33.2 ohm and R4 is 301 ohm. An additional resistor R5 may be connected between the sensing area 50 and the+input of the differential amplifier 70 of approximately 10 Kohm to provide amplifier protection.

A frequency filter 80 is used to isolate the signals of interest. A power line frequency notch filter 80 is used to reject the E field caused by power lines and is set to the power line frequency for the region of use, generally 60 Hz in the United States. In one embodiment, off-the-shelf commercial components are utilized to construct the filter 80. The 60 Hz notch filter 80 is inserted to reject power line and minimizes the chance of saturation of the next amplifier stage for the 60 Hz noise. Other filters may also be used depending upon the operating environment, such as differing noise parameters for 50 Hz and 400 Hz electrical environments. Those skilled in the art are familiar with the appropriate resistor and capacitor arrangement necessary to produce the notch filter 80.

Other filters include bandpass, highpass and lowpass filters that are used in certain circumstances. In one embodiment the invention is intended to detect the 60 Hz power lines, and a bandpass filter about 60 Hz is used. In other embodiments the 60 Hz noise has interfering signals such that commutating or digital signal processor filtering is required to select a smaller bandwidth for detection.

The buffer amplifier 90 provides high input impedance to the filter 80 while providing additional gain and a low impedance source for the voltage measuring device. Typically the measuring device is a sample-and-hold circuit followed by an analog-to-digital (A/D) converter and subsequent processing circuitry.

The buffer amplifier stage 90 in one embodiment is a second field-effect operational amplifier U2 (op amp TLC2272) and is shown with unity gain but could be used to achieve an approximate gain of 20 dB. A 15 v DC power is supplied by a power source, such as common dry cell batteries, although any power source with acceptable output may be used. The output signal of the sensor device is delivered to the next stage of the detection system.

The sensor does not require unique components and persons skilled in the art will choose components that will enable optimal configuration to achieve the objectives of the sensor's application. The combination of the sensing elements and guard in conjunction with the bootstrapped differential amplifier and other elements enables the unexpected sensing of electric field disturbances in a wide array of applications.

Figure 2:
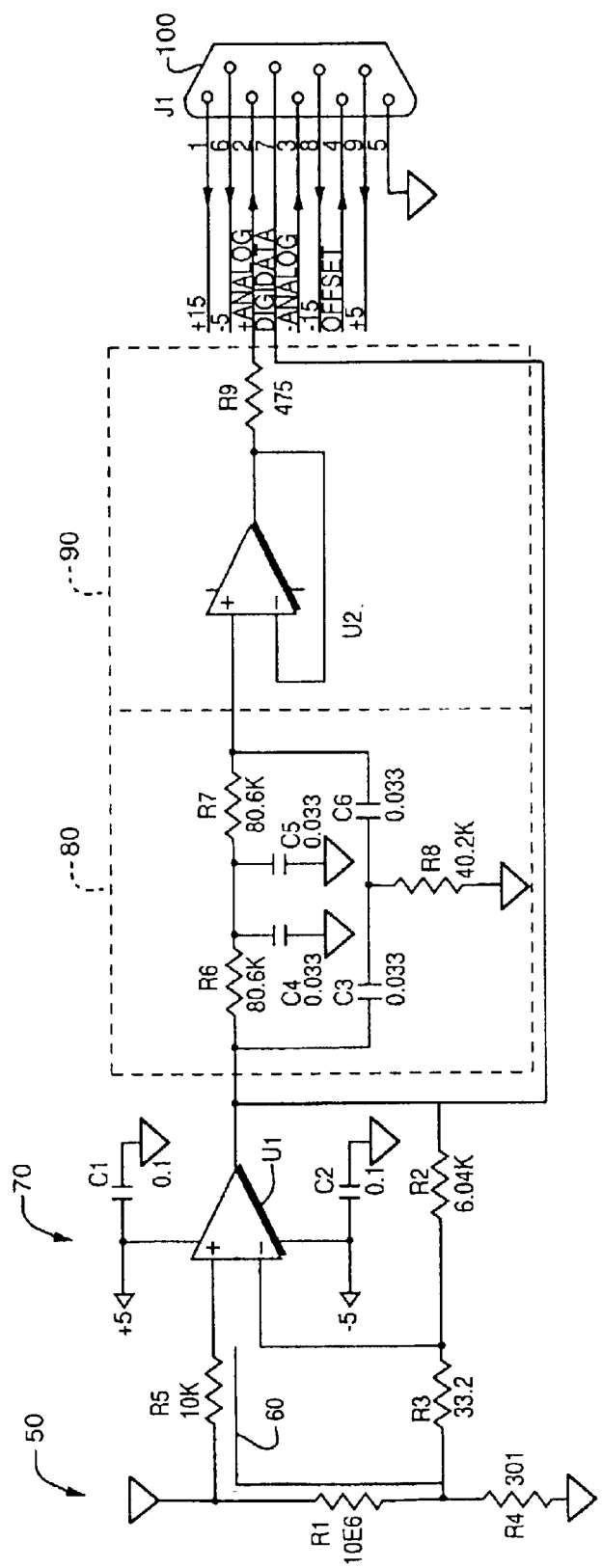
FIG. 2 is a general schematic for a single sensor configuration.

FIG. 2 is a schematic of one circuit illustrating the component selection for the differential amplifier as well as the electrical interconnection. In this embodiment an off-the-shelf commercial components are utilized. A field-effect operational amplifier (op amp) U1 such as TLC2272 is used to perform impedance matching for the sensing antenna 50. In this circuit, the sensing antenna 50 is a small metal pad on a printed circuit board with a corresponding guard 60 on the opposite side of the board. The effective antenna impedance is approximately 1000 Mohms and the sensing area signal is amplified to a low (≅50 ohms) source by the amplifier U1. The bootstrapping interface discussed herein establishes the high impedance input and provides amplification.

A 60 Hz notch filter 80 is inserted to reject power line and signal noise and minimizes the chance of saturation of the final amplifier stage 90. The selection of components R6, R7, R8, C3 and C6 are selected as known in the art and other values are possible. There may also be operating environments where other frequency ranges are excessive, such as 50 Hz and 400 Hz, and the notch filter(s) are designed to eliminate the most detrimental interference.

The second field-effect operational amplifier (op amp) U2 90 is used to achieve an approximate gain of up to 20 dB. DC power is supplied by common dry cell batteries in one embodiment, however power can also be provided from an AC source after AC/DC conversion. Other power sources such as solar and coupling power from power lines have also been contemplated. The sensor device output signals are delivered to the next stage of the detection system (not shown) through a connector J1.

Figure 3:
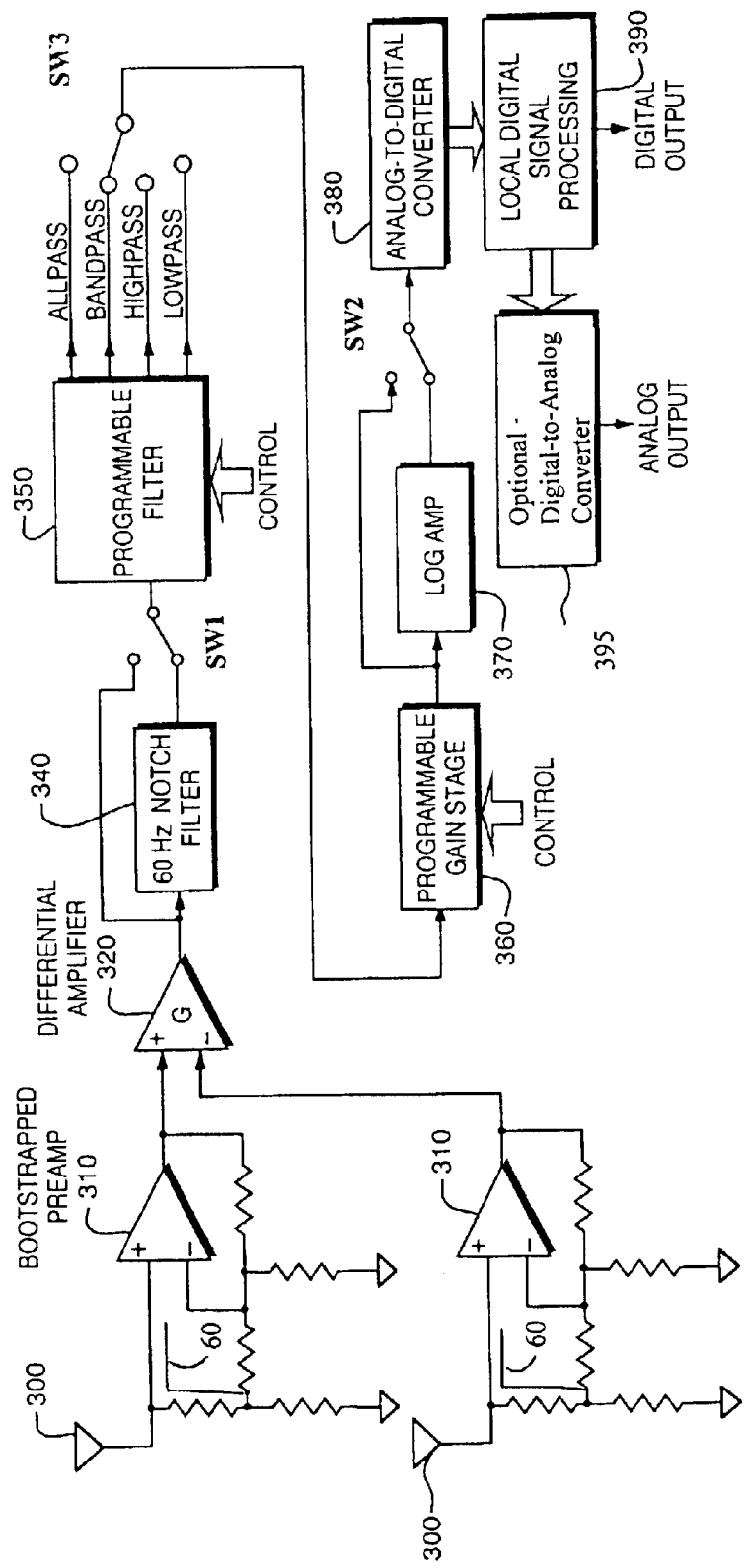
FIG. 3 illustrates a dual differential sensor system with various programmable configurations.

FIG. 3 shows one embodiment that encompasses dual sensors 300 for a differential field sensor and the signal processing requirements. It should be understood that the device can be run in single ended mode by grounding one antenna 300 which can allow for redundancy. The parallel connections allow the processing unit 390 to gather data from the multiple sensors 300 and process the data accordingly.

This embodiment employs two sensing elements 300 and two corresponding bootstrapped preamps 310 for boosting the input signal strength. The output of the preamps 310 are connected to a differential amplifier 320 and 60 Hz notch filter 340. The notch filter 340 can also be bypassed by switch SW1. A programmable filter 350 and programmable gain stage 360, and logarithmic amplifier 370 (logamp) are employed to process and enhance the electrostatic signature of the detected source prior to its passage to the analog and digital converters 380 generating digital data representing the received signals. The digitized data is coupled to a processing unit 390 such as a microprocessor or microcontroller which performs processing to configure the output signal parameters for use by the next stage of the detection system. An optional Digital-to-Analog converter 400 can be used to re-convert the digitized data to analog form in order to have the raw data presented to the user.

In this embodiment the programmable filter 350 includes an Allpass, Bandpass, Highpass and Lowpass filtering depending upon the application. The selectability of filtering via switch SW3 allows flexibility in isolating the electrostatic field being analyzed as well as eliminating interfering noise. The programmable gain stage 360 permits variable boosting of the received signal. The log amp 370 boosts the signal depending upon the input level to a level satisfactory for further processing. In this embodiment the log amp stage 370 can be bypassed by switch SW2. The control to the programmable filter 350 and gain stage 360 are commands from the local signal processor although external commands via hard wired or wireless are within the scope of the invention. The output of the differential field sensor is delivered to the next stage of the detection system at the output terminal.

In one embodiment, the processing unit 390 has internal memory (not shown) or connection to external memory that stores the measured data or counter information. The counter data can track the number of times the threshold level was reached indicating, for example, the number of vehicles passing a toll or down a street. The output data can also be stored to establish a library of E field signatures that allow for classification and identification of measurements. This stored data is useful when comparing the present measurements to the existing database. For example, the signature of a certain ballistic can possibly be matched for future measurements.

Figure 4:
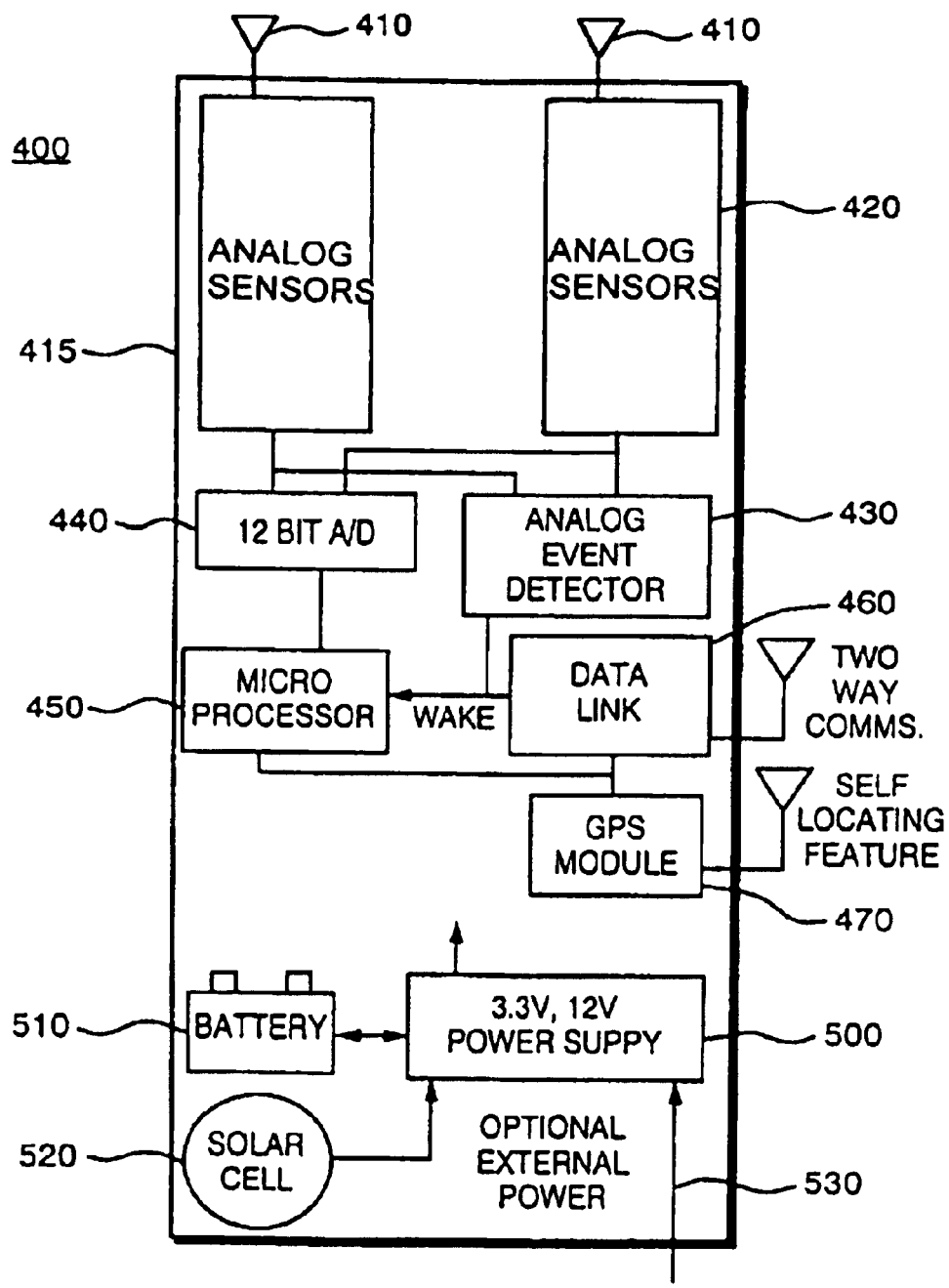
FIG. 4 shows one embodiment of a unit housing the E field electronics

FIG. 4 illustrates one embodiment for an E field unit 400 encompassing various supporting functionality. The sensing elements 410 provide the E field measured data to the analog sensors 420 that filter and amplify the signals as described herein. The analog output from the sensors 420. The dual sensors 420 can be used singularly and allow for redundancy and switch from a faulty sensor to a working sensor. Alternatively, the dual sensors can take data in different axes or otherwise supplement the measurement information. Multiple sensor measurements aid in coherent processing as described herein. The entire unit can be encased in a housing 415 to provide protection from the elements.

The analog output of the processing electronics 420 is delivered to an event detector 430 that is preset to a certain voltage level in order to wake up the microprocessor 450 once a certain level is detected. The term microprocessor, microcontroller and processing unit are used interchangeably to denote a processing section and associated elements such as timing and memory. In one embodiment, the sensing unit 400 processes the information internally and stores the data until a certain threshold level is detected, a time interval elapsed, a count number is attained or an instruction is received before transmitting date externally. The event detector 430 allows elements of the unit 400 to consume lower power levels until a threshold level is attained or for batched transmission of data. The output of the processing electronics 420 also connects to an analog-to-digital (A/D) converter 440 that converts the analog voltage signal to a digitized form.

The microcontroller 450 is the control center for the unit 400 and controls the subsequent processing once an event is detected. In a first embodiment a global position system (GPS) module 470 is coupled to the microcontroller 450 in order to establish an extremely accurate standard time reference as well as geographic location. Other types of clock references are also within the scope of the invention such as internal local oscillators. The microcontroller 450 uses the position information and timing data to determine the location of the unit and time of the measured event.

The microcontroller 450 is also coupled to a datalink 460 such as a cellular modem module that is a low power RF link to the outside world and allows the unit 400 to transmit and receive data. The data link 460 transmits the measured data as well as receives instructions or commands from a central host. For power savings the unit can batch measurements for periodic transmission or only transmit signals upon the occurrence of certain events. There are additional elements sometimes associated with the microcontroller 450 to provide random access memory (RAM) and flash memory as well as timing. The datalink 460 is a single example of the wireless connectivity available to communicate with a central host or other units. The communications can also incorporate RFID technology whereby the data is only transmitted once a signal triggers the transceiver. Hardwired communications is also a viable implementation depending upon the application, and an external interface couples to the appropriate interface card. Optional components include audible and visual indicators (not shown) that would generate alerts once an event is detected.

The power source for the unit 400 is derived from several possible sources. There can be an external power supply connected to the external connection 530 that provides the power directly or through a transformer unit (not shown). In the illustrated embodiment the power source is DC storage cell 510 supplying a 3.3V DC or 12V DC. A battery 510 may be the sole source of power, and coupled to the power distribution section 500 that redirects the power and encompasses appropriate filtering and fuse protection. A solar cell 520 can be used to operate the unit 400 and also provide a power source that can charge the battery 510 and extend the life span of the unit 400. In one implementation, the unit is coupled to power lines and draws power from the high tension lines. As should be appreciated the supplemental components are applications specific and the cost, weight, size, power are some of the factors that contribute to the specific embodiment for a particular application.

The solar cell power 520 is most practical to those implementations wherein the unit is mounted to a structure for extended periods of sensing. For example, a perimeter security system that places a plurality of units around a house or site can secure the sensors to fence posts of other structures that allow sunlight to charge the unit.

One feature of the present invention is a built-in-test capability. A metal rod or conducting strip (not shown) on the printed circuit board can be charged by coupling to the power source, wherein the sensor picks up the signal energy and tests the functionality.

As noted herein, the present invention detects the E field distortion of moving objects. Across the entire globe there is an atmospheric potential gradient (electric field) of approximately 200 V/meter of altitude. Research indicates that the natural electric field is geographically consistent, with the exception of atmospheric anomalies such as localized thunderstorms.

Changes in the state of presence, such as by walking as opposed to standing still, distorts the iso-potential lines. The individual footsteps and positioning is quantifiable via the sensor data. Similarly, high-voltage sources, static generators, and ionization have been found to create detectable electrostatic distortions. Connecting the E-field sensor of the present invention to a common oscilloscope and trace recorder enables detection and visual indication of a person walking past the sensors. Further, the detection and display of individual footsteps in the sensor's vicinity is also enabled, as is shown by the traces.

Figure 5A:
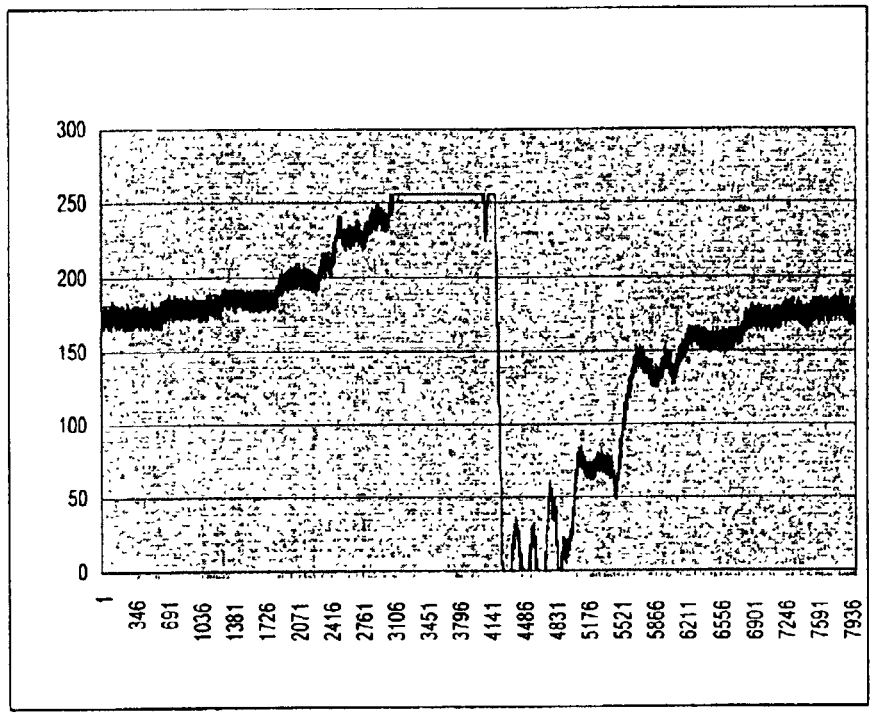
FIG. 5a shows test results measuring the movement of a human passing a single sensor
Figure 5B:
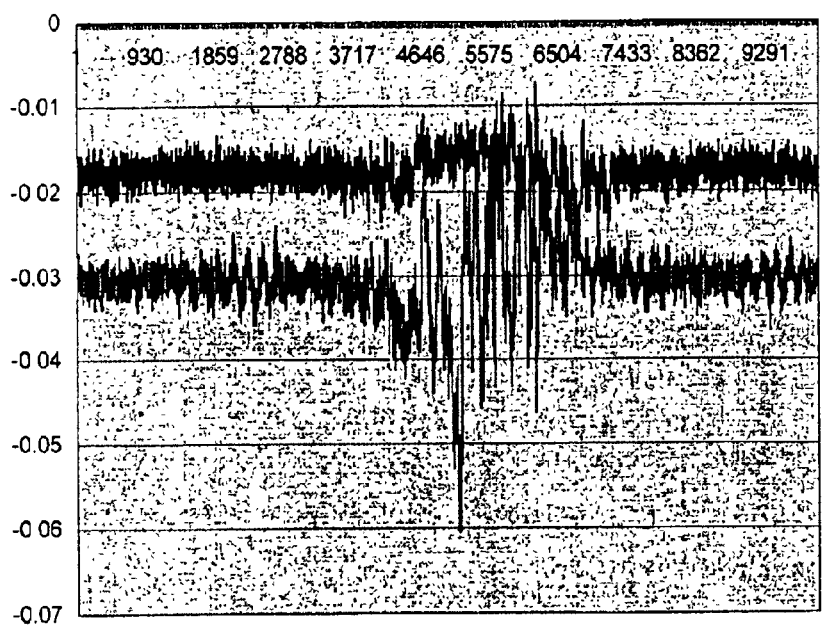
FIG. 5b shows the test results from a moving truck passing two sensors

Referring to FIGS. 5a and 5b the electric field distortions created by a moving object in the E-field are illustrated. The sensors detect the distortion, d|E|/dt, created as a person moves through the electric field gradient of the atmosphere. Using the d|E|/dt sensors eliminates drift problems and allows detection of small "AC" changes in large "DC" fields. It also allows some measurements such as closest approach to be a zero crossing detect as opposed to an estimate of the maximum.

Referring to the test results of FIG. 5a, a single sensor was deployed and a person walked nearby the detector as measured by a DC coupled oscilloscope. The E field axis uses millivolts as the unit and the time axis is in milliseconds. As depicted, the distortion created by the walking person caused a noticeable measurement several hundreds of millivolts about the noise floor which is about 160 millivolts. The point of closest approach is seen as the nearly vertical line at or about 4141 milliseconds. This distortion is easily detected and depends upon a number of factors including the size of the sensing element, the amount of amplification, the filtering, as well as the size of the object making the distortion and the distance from the object to the sensor. In one embodiment, the detection range was approximately 20–25 meters indicating that the device would be an excellent motion sensor for inside/outside a home as well as for military applications. Thus as a motion sensor, the E field detectors can detect movement of persons and objects and there is no practical circumvention.

FIG. 5b represents test results from a truck passing nearby a motion sensor unit, wherein this motion sensor unit was actually dual differential detectors employed in a crossed 'X' shape pattern. The use of multiple sensors and multiple axis observations enhances measurement capability by permitting coherent processing and providing an additional set of information. For example, the bearing or direction of the moving object can be ascertained by examining the multi-axes data. Each sensor has an applicable noise floor or base level and the E field distortion is reflected by the marked increase in the voltage levels.

Figure 6:
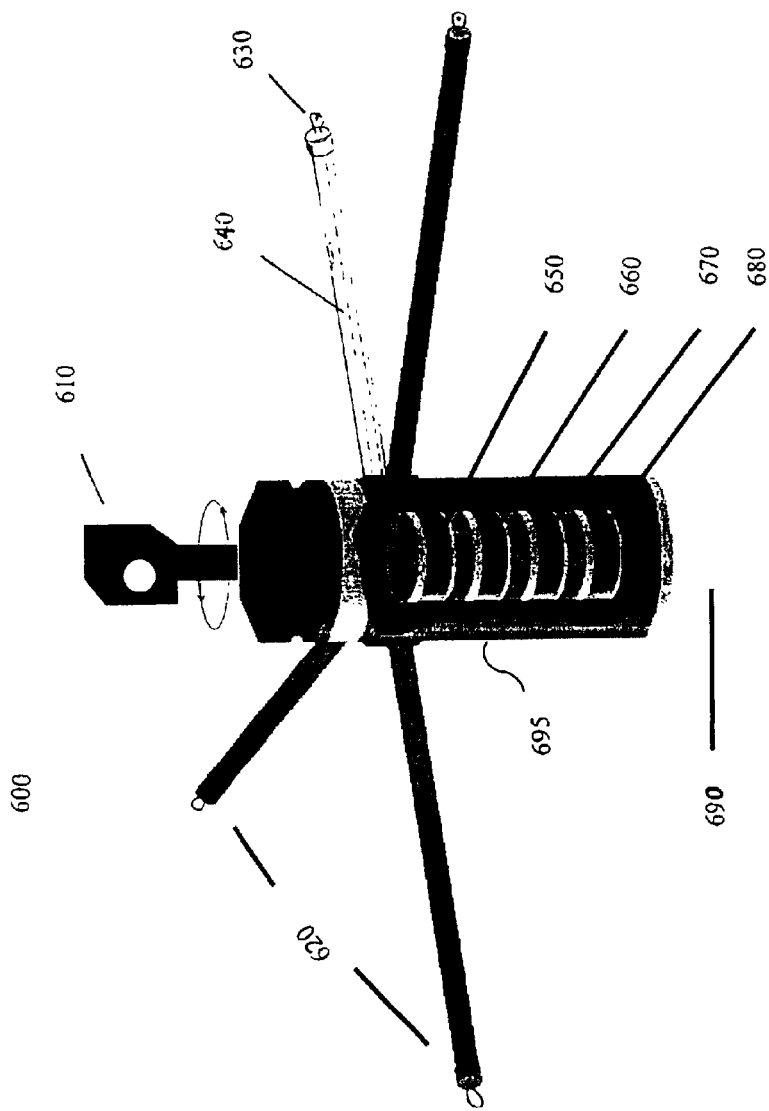
FIG. 6 is an example of a battlefield sensor system having multiple sensing devices

As noted herein, the E field sensor of the present invention can be incorporated with other sensors types and integrated into existing sensor designs. For example, the ground sensor of FIG. 6 is a low power, miniature internetted unattended sensor 600 intended for battlefield deployment. The sensor can be deployed by hand, projectiles, mortars, missiles and aircraft. In this embodiment, there is a rotating camera 610 providing a visual feed. There are several acoustic sensors 620 to pick up various communications for intelligence gathering. At the end of each of the four sensor rods are the sensing elements 630 for the E field detection. A coaxial cable 640 connects from the sensing element 630 to the internal processing section 670 wherein the bootstrapped dual differential amplifier, filter and amplification stages are encompassed within the unit 600. There are also magnetic sensors 660 and seismic sensors 690 that enable comprehensive intelligence gathering and tracking capabilities with everything encased in a sturdy housing 695. The information from the various sensors is processed by the processing section 670 and is relayed to one or more central locations for further processing. In one embodiment the unit is powered by a battery although other power forms are within the scope of the invention. A plurality of units can be deployed to aid in battle strategies and the interconnected sensors cooperate to cover large areas.

Another important application of the present invention is related to inclusion on various deployable sensing systems, such as payloads. The E field sensors are valuable improvements that can be used with or without pods. During battle deployment, aerial sensor types can be deployed by various systems such as parachute, UAV, gliders, and various other airborne vehicles. The sensors typically include imaging systems, GPS/altimeter, data link, sensors and a power source. The cost, size, weight, power consumption of the E field sensors allows incorporation into these devices. And, the sensors contribute to the capability to detect the location of enemy fire and aid in directing a response. The sensors can also help to enhance overall survivability of the UAV's and other airborne sensing devices by providing advance information of threats.

Figure 7A:
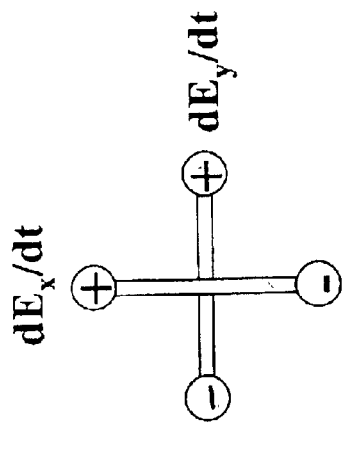
FIG. 7a shows four sensors orthogonally oriented for measuring in two axes
Figure 7E:
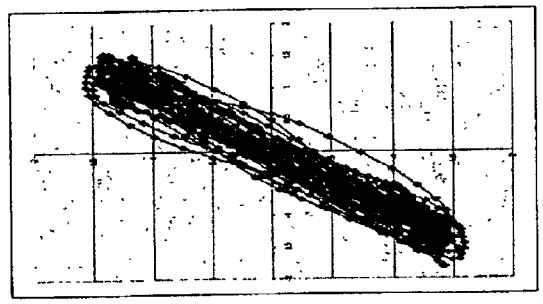
FIG. 7b–7e are test results as the sensors approach electric power lines
Figure 7D:
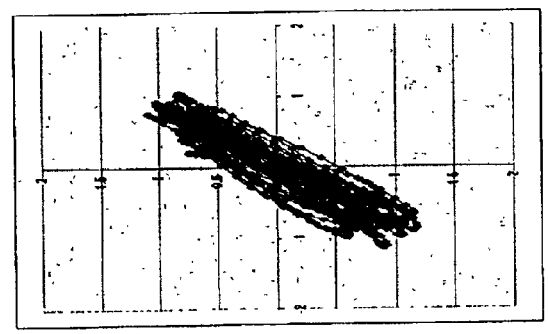
Figure 7C:
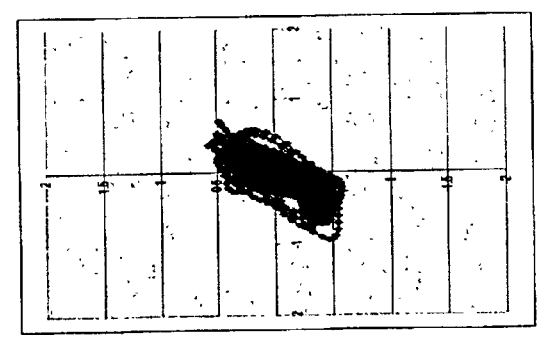
Figure 7B:
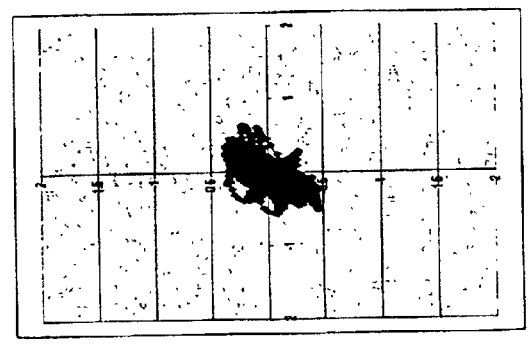
Figure 1:
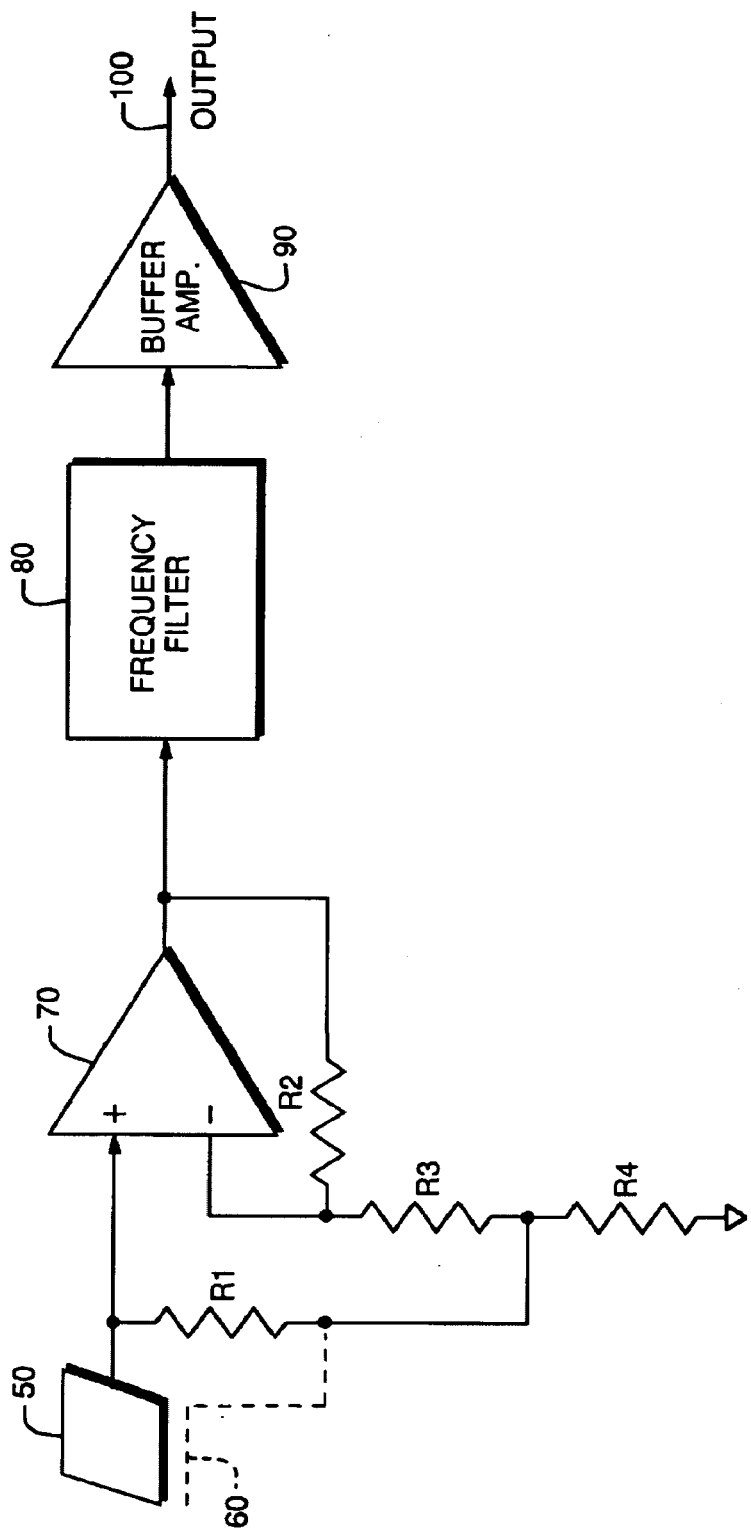
Figure 2:
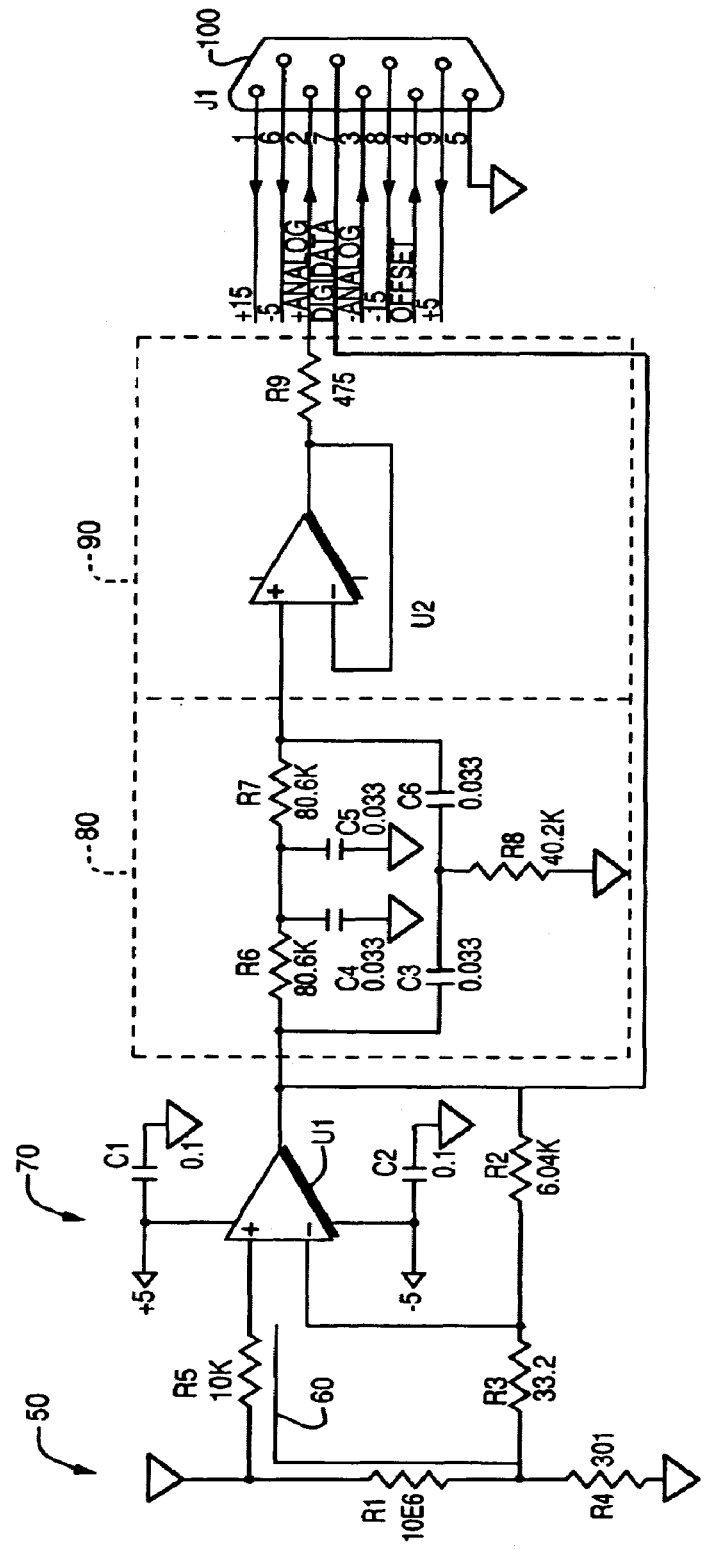
Figure 3:
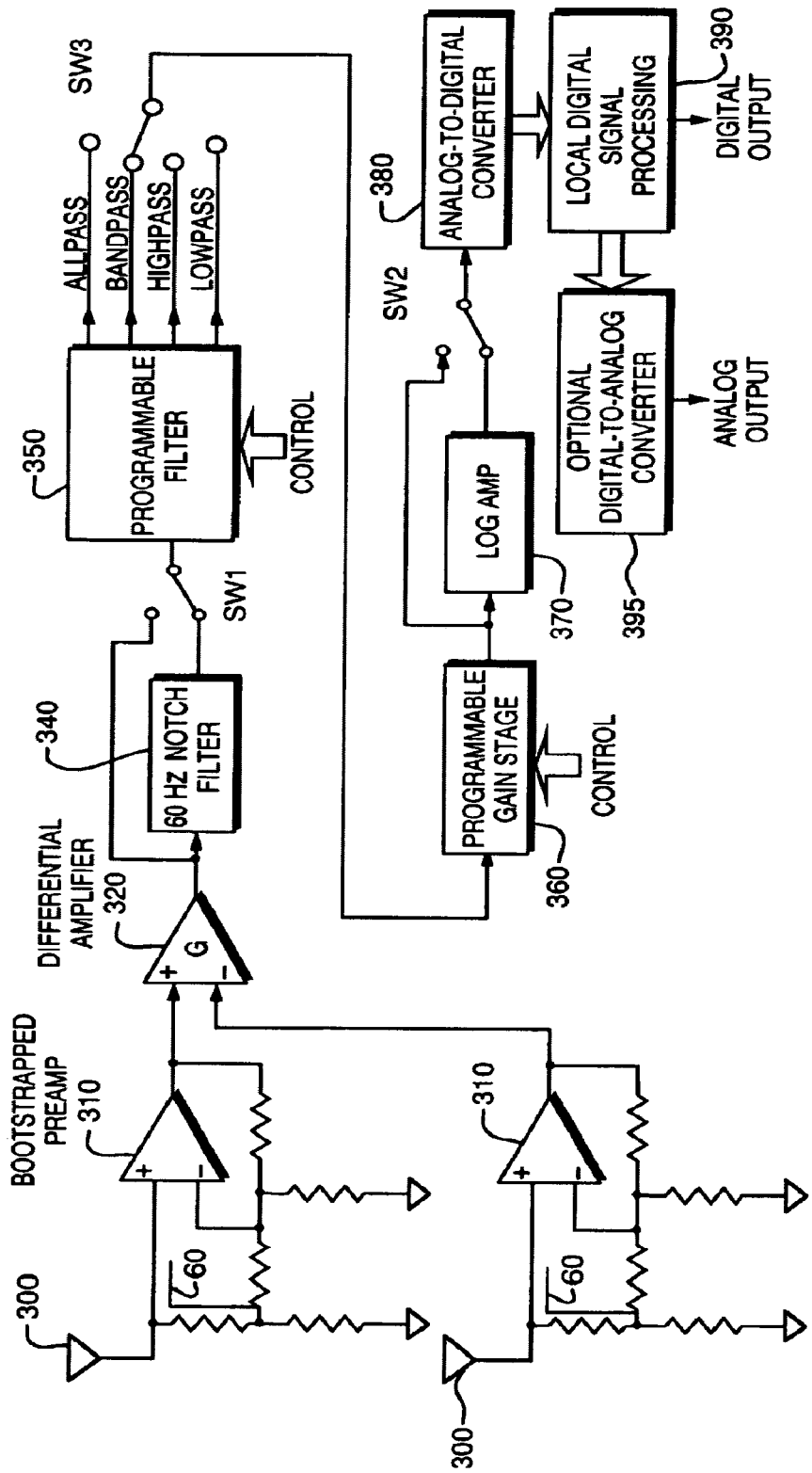
Figure 4:
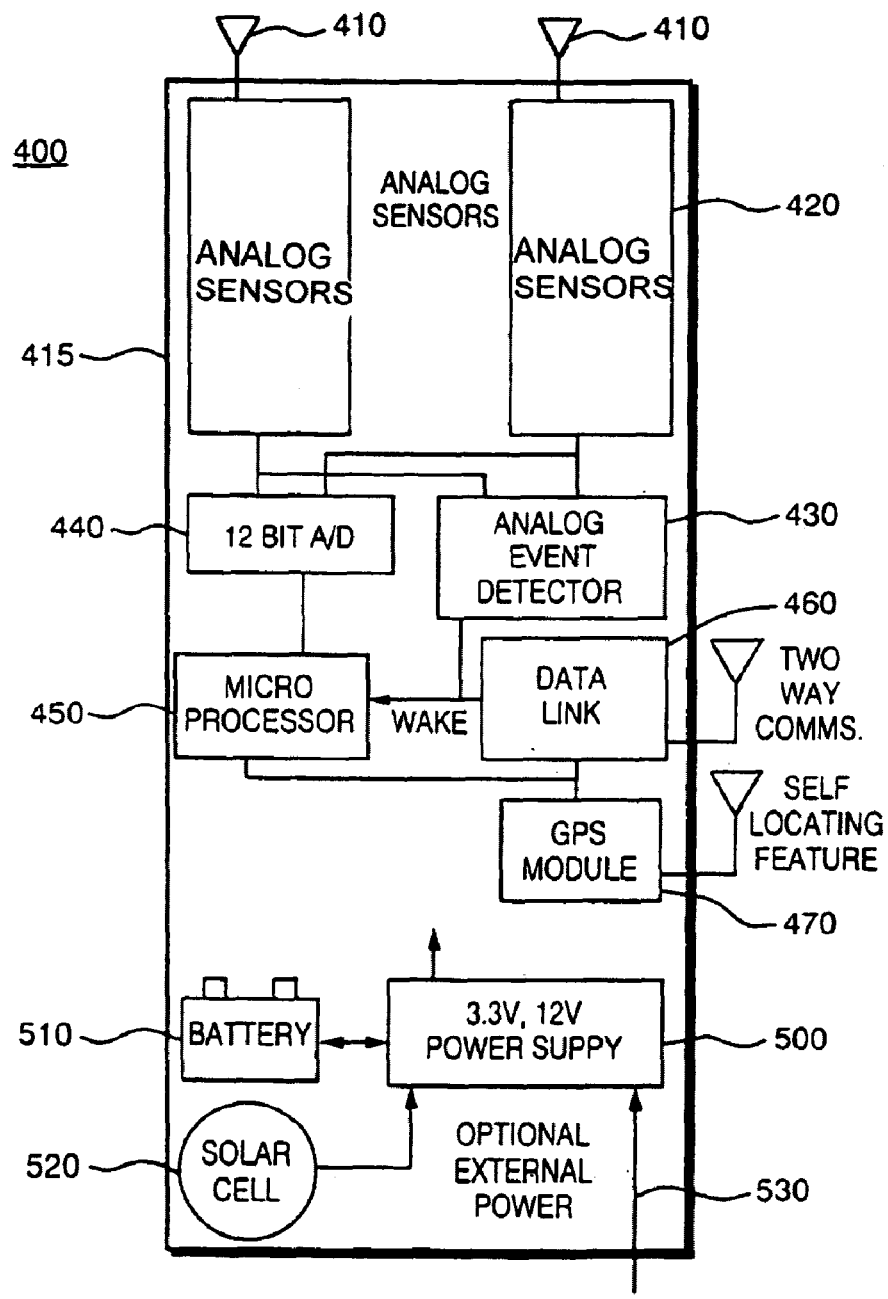
Figure 5A:
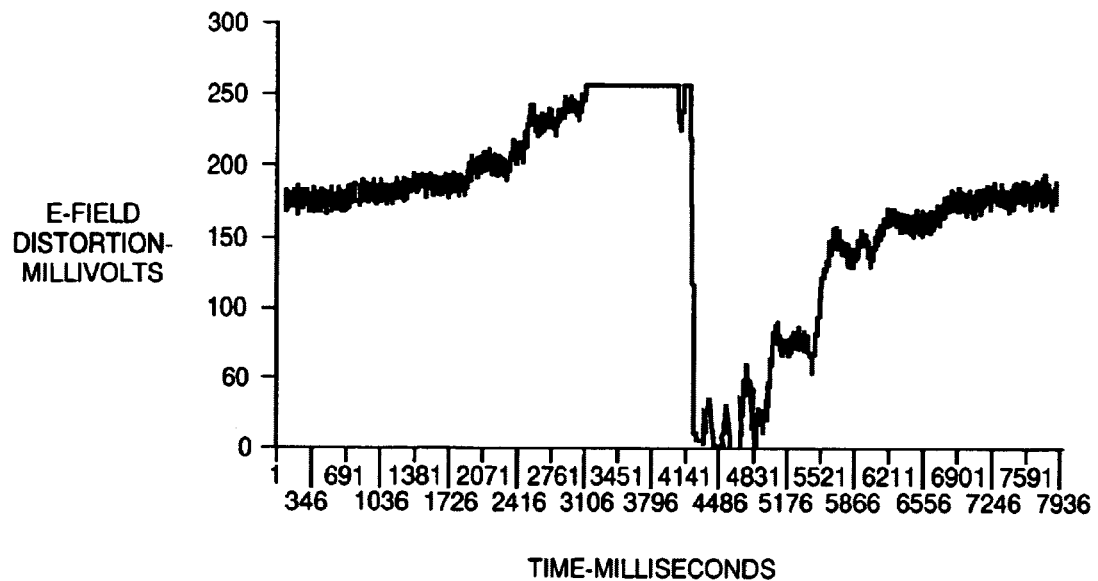
Figure 5B:
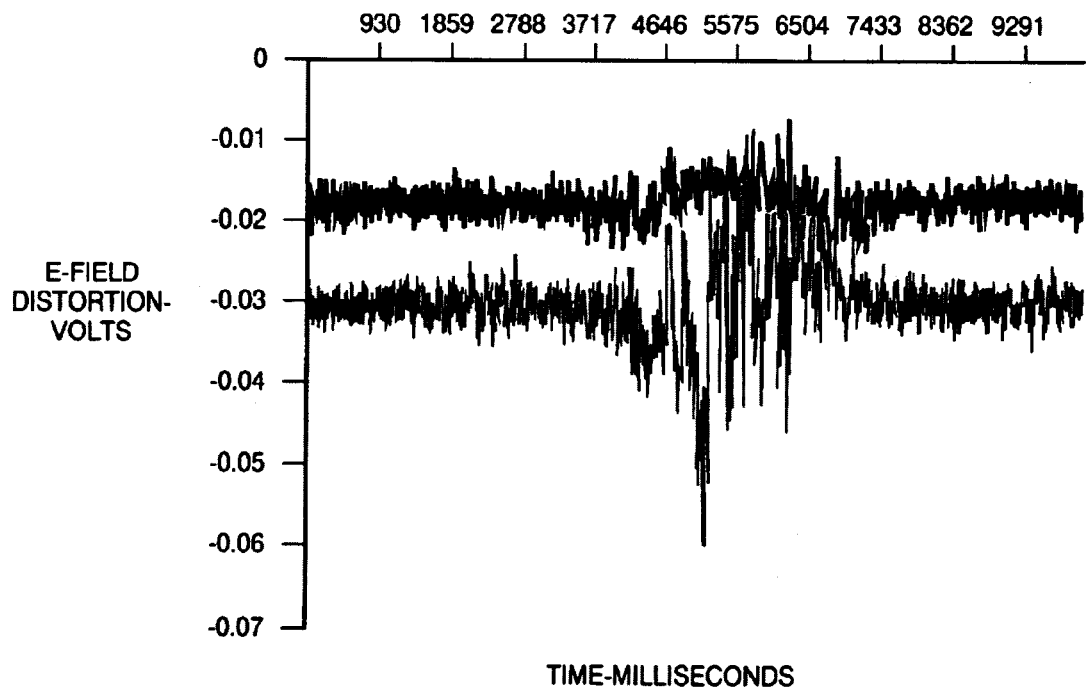
Figure 6:
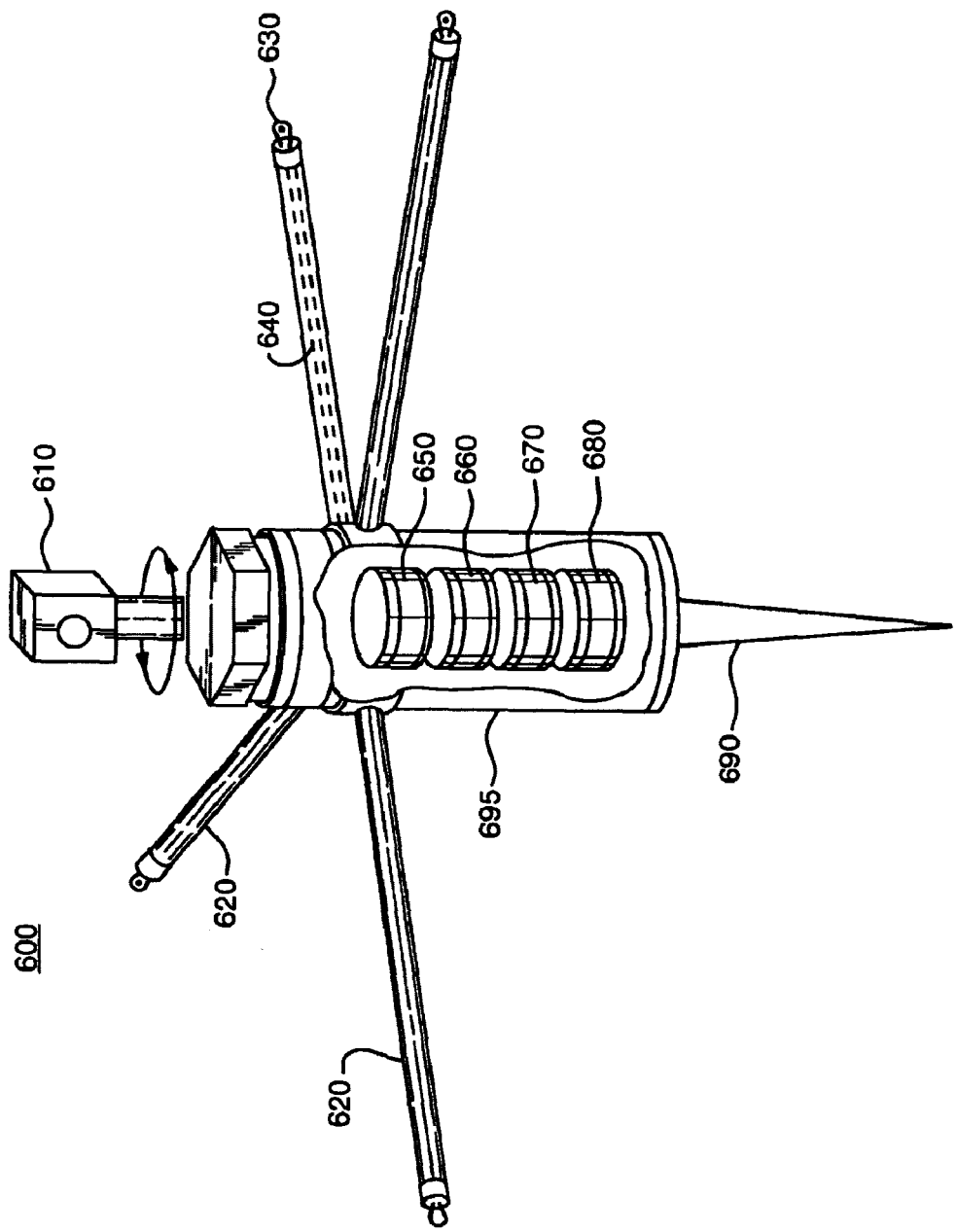
Figure 7A:
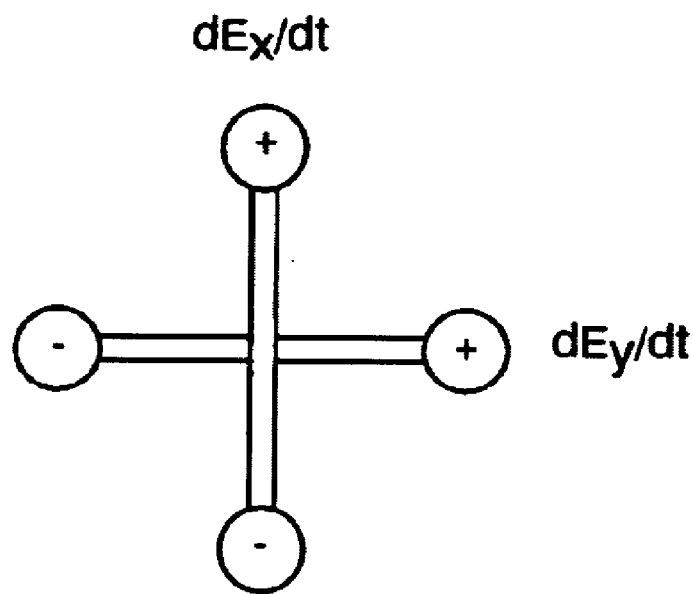
Figure 7B:
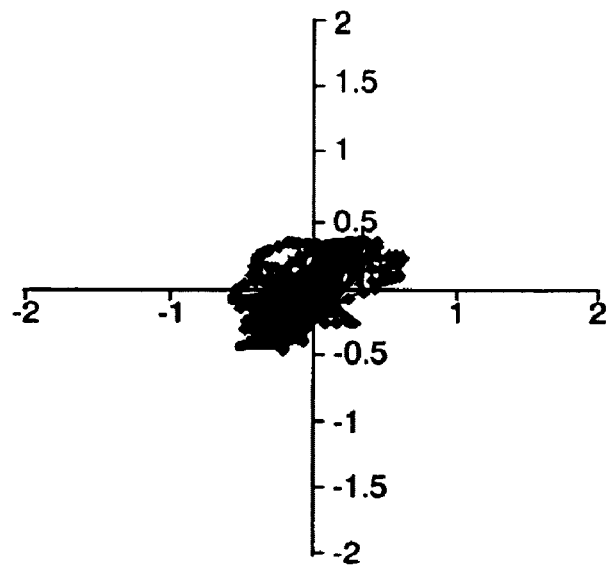
Figure 7C:
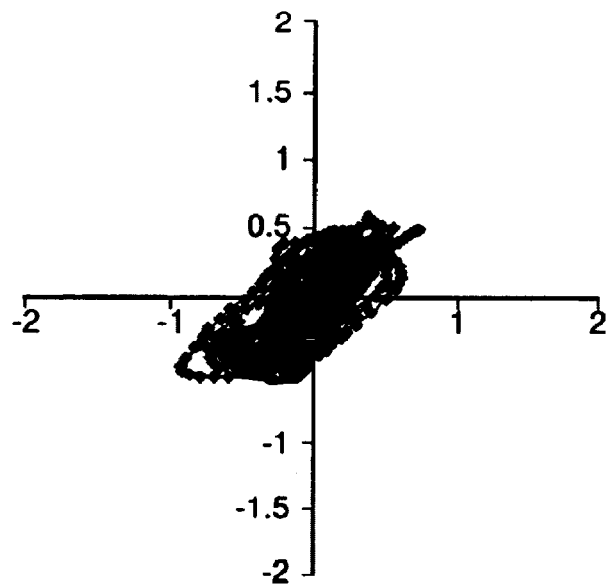
Figure 7D:
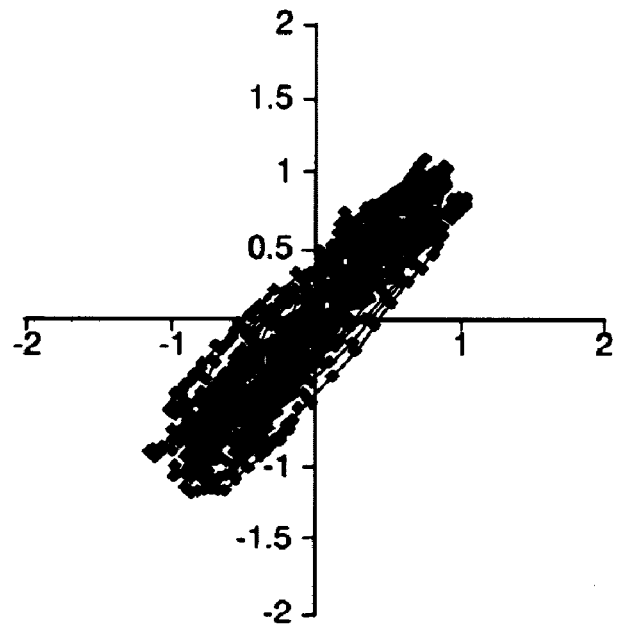
Figure 7E:
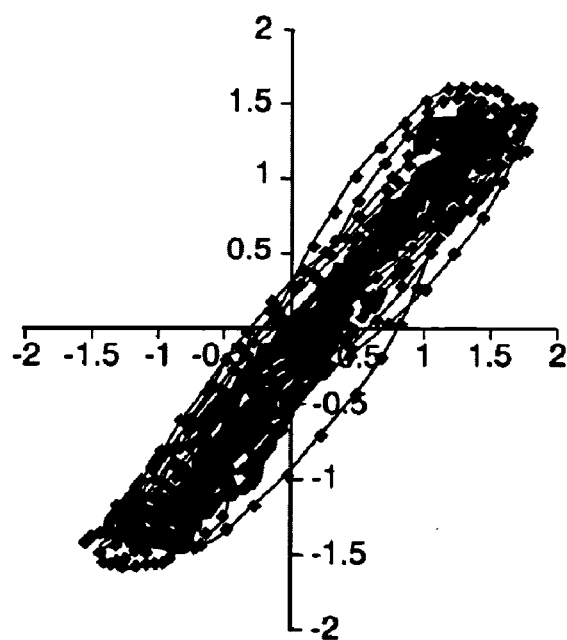

Referring to FIGS. 7a–7e, the E field distortion associated with power lines is described. In one embodiment, dual spectrum electric field (E) and magnetic field (H) sensors are developed by dual differential sensors using four sensors located at the ends of extended arms as represented by FIG. 7a.

In the power line embodiment, the sensors are measuring the 60 Hz signals, so a bandpass filter would be used to isolate the 60 Hz signals. FIGS. 7b–7e show test results as the E field sensor approaches the high voltage power lines. The 60 Hz amplitude and phase coherence increases and is easily discernable.

Thus, one embodiment of the present invention is a high power detector that can be used on airplanes and other airborne objects and vessels to alert the operator to potential hazards. In one test, the flow of electricity through the power lines is detectable greater than 50 feet from the lines. A unit can be integrated into the existing helicopter electronics or made as a separate unit. In either case, the E field sensing would cause an alarm, audible and/or visual, to alert the operator once a threshold level is reached.

Of particular importance is a warning system for helicopters. There are numerous helicopter crashes each year related to helicopters striking power lines. Helicopter blades in rotation have been noted to create appreciable interference that saturates the amplifiers within the 60 Hz region of a bandpass filter. In the helicopter embodiment, bandpass filters may not provide adequate filtering and DSP or commutating filtering that narrows the bandwidth can be used, wherein such filters are known in the art.

Another implementation is a safety warning device for utility personnel to indicate power on the lines, especially when the shorting system used by operators is not in place. There are various situations where power feeds the power lines from generators that are connected to the lines and the present device allows an inexpensive alerting device.

Although the dual spectrum measurements from the X and Y axis of the sensor of FIG. 7a are not necessary, additional data from the measurements may be used to detect and classify the load types such as resistive, inductive and motors with solid state controllers as well as the relative magnitudes. The sensors also detect the imbalances when loads are applied and removed and the events occurring on a grid. The leakage from the high tension lines can also be used to power the sensor.

As discussed herein, coherent processing from multiple sensors of a single measurement greatly improves the measurement capabilities by reducing the impact of noise and interference. The coherent processing is described in detail in related application U.S. application Ser. No. 10/256812, filed Sep. 27, 2002 which is incorporated by reference.

The coherent noise reduction works because the background noise is "far field" and low frequency. This means that two sensors placed apart see exactly the same background noise. If the signal of interest is in the near field, (less than 100 feet in one test) the sensors see the signal of interest at different signal strengths. When the two sensors are subtracted, the background noise disappears while some of the signal of interest remains. No knowledge of the background noise is required. This technology is well known to those skilled in the art and is applied to noise reduction head sets and microphones. This is distinguishable from bandpass filters, low pass filters, and high pass filters, that essentially reject interfering signals within a certain frequency. Bandpass filters reject signals in a certain frequency band. High pass filters reject lower frequency signals while allowing higher frequency signals. Low pass filters allow certain lower frequency signals while rejecting high frequency signals.

The noise reduction processing can be shown by the following equations for two sensors:

S1(t) is the total signal received at sensor 1
S2(t) is the total signal received at sensor 2
P1(t) is the signal at S1 from the signal of interest
Nb(t) is the background noise (assumed to be far field and therefore the same at both sensors)
P2(t) is the signal at S2 from the signal of interest
S1(t)=Nb(t)+P1(t)
S2(t)=Nb(t)+P2(t)
P2(t)=kP1(t)
K<1
Sdiff=S1(t)−S2(t)=(Nb(t)+P1(t))−(Nb(t)+P2(t))
Sdiff=P1(t)−kP2(t)
Sdiff=(1−k)P1(t)

The signal of interest is somewhat reduced in strength but background noise is essentially eliminated. Thus signal to noise ratio (SNR) is greatly improved.

The inventors anticipate that persons skilled in the art can apply the coherent processing outputs of the present invention to analysis of the detected E-field disturbance such that the particular source of the E-field disturbance can be detected at useful distances and distinguished from other E-field disturbance and noise sources in the vicinity.

The objects and advantages of the invention may be further realized and attained by means of the instrumentalities and combinations particularly pointed out in the appended claims. Accordingly, the drawing and description are to be regarded as illustrative in nature, and not as restrictive.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. An electric field sensor for detecting electrostatic field disturbances, comprising:
   a sensing element for detecting electric field signals;
   a guard area proximate said sensing element;
   a differential amplifier stage with bootstrapping and coupled to said sensing element on an input side;
   a filter stage connecting to an output side of said amplifier stage;
   an analog to digital converter coupled to said filter stage for converting said electric field signals to digital data;
   a second amplifier stage between said filter stage and said analog to digital converter; and
   a microcontroller coupled to said analog to digital converter for processing said digital data.

2. The electric field sensor according to claim 1, further comprising a transceiver coupled to said microcontroller.

3. The electric field sensor according to claim 1, further comprising a partial Faraday shield covering a portion of said sensing element.

4. The electric field sensor according to claim 1, further comprising a means for setting a threshold level.

5. The electric field sensor according to claim 1, further comprising a visual indication.

6. The electric field sensor according to claim 1, further comprising an audio.

7. The electric field sensor according to claim 1, wherein said filter stage is selected from the group consisting of: a notch filter, a bandpass filter, a highpass filter and a lowpass filter.

8. An electric field sensor for detecting electrostatic field disturbances, comprising:

a first sensing element for detecting electric field signals;

a first preamplifier coupled to said sensing element, wherein said first preamplifier is coupled to a first bootstrapping circuit;

a second sensing element for detecting electric field signals;

a second preamplifier coupled to said second sensing element, wherein said second preamplifier is coupled to a second bootstrapping circuit;

a differential amplifier coupled to said first preamplifier and said second preamplifier;

a filter stage connecting to said differential amplifier;

an analog to digital converter coupled to said filter stage for converting said electric field signals to digital data; and a microprocessor coupled to said analog to digital converter for processing said digital data.

9. The electric field sensor according to claim 8, further comprising a transceiver coupled to said microprocessor.

10. The electric field sensor according to claim 8, further comprising a gain stage coupled between said filter stage and said analog to digital converter.

11. The electric field sensor according to claim 8, further comprising a visual indication.

12. The electric field sensor according to claim 8, further comprising an audio indication.

13. The electric field sensor according to claim 8, wherein said filter stage is selected from the group consisting of: a notch filter, a bandpass filter, a highpass filter, a lowpass filter, and a commutating filter.

14. A motion sensing device, comprising:

a power source;

at least one sensing element for detecting electric field disturbances of moving objects;

a differential amplifier with a bootstrap configuration coupled to said sensing element;

a filter section connecting to said differential amplifier;

a second amplifier stage coupled to said filter section;

an analog to digital converter coupled to said filter section second amplifier stage for converting said electric field signals to digital data; and a microcontroller coupled to said analog to digital converter for processing said digital data.

15. The motion sensing device according to claim 14, further comprising a guard proximate said sensing element.

16. The motion sensing device according to claim 14, further comprising a global positioning system.

17. The motion sensing device according to claim 14, wherein said moving objects are selected from at least one of the group consisting of: humans, animals, vehicles, cargo and current through power lines.

18. The motion sensing device according to claim 14, wherein four sensing elements are placed apart and orthogonally oriented.

19. The motion sensing device according to claim 14, further comprising a data link from said device to a host system.

20. The motion sensing device according to claim 14, wherein said power source is selected from the group consisting of a battery, solar cell and connection to electrical source.

* * * * *

UNITED STATES PATENT AND TRADEMARK OFFICE
CERTIFICATE OF CORRECTION

PATENT NO. : 6,922,059 B2
DATED : July 26, 2005
INVENTOR(S) : Paul A. Zank et al.

It is certified that error appears in the above-identified patent and that said Letters Patent is hereby corrected as shown below:

Drawings,
Delete figures 1-7e, and insert the following drawing sheets.

Column 2,
Line 20, delete "arc", insert -- are --.

Column 5,
Line 34, delete "1&W", insert -- I&W --.

Column 6,
Line 16, delete "Known", insert -- known --.

Column 8,
Line 57, delete "a a", insert -- a --.

Column 9,
Line 3, delete "clement", insert -- element --.
Line 27, delete ".".
Line 41, insert -- . -- after "invention".

Column 11,
Line 12, delete "R3=1 k", insert -- R3=1k --.
Line 12, delete "R4=9 k", insert -- R4=9k --.

Column 18,
Line 62, insert -- output indication -- after "audio".

UNITED STATES PATENT AND TRADEMARK OFFICE
CERTIFICATE OF CORRECTION

PATENT NO.    : 6,922,059 B2
DATED         : July 26, 2005
INVENTOR(S)   : Paul A. Zank et al.

It is certified that error appears in the above-identified patent and that said Letters Patent is hereby corrected as shown below:

Column 20,
Line 10, delete "filter section".

Signed and Sealed this

Seventh Day of February, 2006

JON W. DUDAS
*Director of the United States Patent and Trademark Office*